US009810905B2

(12) United States Patent
Kodama et al.

(10) Patent No.: US 9,810,905 B2
(45) Date of Patent: Nov. 7, 2017

(54) SUPPORT INFORMATION DISPLAY METHOD, MAINTENANCE SUPPORT METHOD OF SUBSTRATE PROCESSING APPARATUS, SUPPORT INFORMATION DISPLAY CONTROL APPARATUS, SUBSTRATE PROCESSING SYSTEM AND RECORDING MEDIUM

(71) Applicant: TOKYO ELECTRON LIMITED, Tokyo (JP)

(72) Inventors: Toshiaki Kodama, Nirasaki (JP); Toru Yamauchi, Nirasaki (JP); Sensho Kobayashi, Nirasaki (JP); Hiroshi Nakamura, Nirasaki (JP); Gaku Ikeda, Nirasaki (JP); Kazuya Uoyama, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 450 days.

(21) Appl. No.: 14/174,506

(22) Filed: Feb. 6, 2014

(65) Prior Publication Data
US 2014/0240484 A1 Aug. 28, 2014

(30) Foreign Application Priority Data

Feb. 25, 2013 (JP) .................. 2013-034515

(51) Int. Cl.
*G02B 27/01* (2006.01)
*H01L 21/67* (2006.01)
(52) U.S. Cl.
CPC ...... *G02B 27/017* (2013.01); *H01L 21/67288* (2013.01); *G02B 2027/014* (2013.01); *G02B 2027/0138* (2013.01)

(58) Field of Classification Search
CPC ............ G02B 27/017; G02B 2027/014; G02B 2027/0138; H01L 21/67288
See application file for complete search history.

(56) References Cited

U.S. PATENT DOCUMENTS 6,016,562 A * 1/2000 Miyazaki ............... G01R 31/01
257/E21.53
7,047,095 B2 * 5/2006 Tomoyasu ....... G05B 19/41875
700/108

(Continued)

FOREIGN PATENT DOCUMENTS

JP  2010-220074 A  9/2010
JP  2012-186455 A  9/2012

OTHER PUBLICATIONS

Horoshi Shimoda, "Analysis of human factor for preventive safety", Measurement and Control Aug. 2006, Japan, The Society of Instrument and Control Engineers, Aug. 10, 2006, vol. 45, No. 8, pp. 700-705.

(Continued)

*Primary Examiner* — Sath V Perungavoor
*Assistant Examiner* — Philip Dang
(74) *Attorney, Agent, or Firm* — Nath, Goldberg & Meyer; Jerald L. Meyer

(57) ABSTRACT

A support information display method is provided with an acquiring process for acquiring a first image by photographing, via a camera provided in a head mount display, a predetermined part of a substrate processing apparatus as a maintenance object, an estimating process for estimating the support information related to the predetermined part in the first image from information stored in a database, an image creating process for creating a second image by converting the support information estimated in the estimating process into an image, and a displaying process for displaying the (Continued)

second image on the head mount display in order for the operator to visually recognize the support information.

17 Claims, 4 Drawing Sheets

(56) References Cited

U.S. PATENT DOCUMENTS

| | | | | |
|---|---|---|---|---|
| 7,903,048 | B2* | 3/2011 | Yanagisawa | G01C 21/36 345/7 |
| 8,035,576 | B2* | 10/2011 | Ishino | G02B 27/017 345/7 |
| 8,300,025 | B2* | 10/2012 | Katayama | G01S 5/16 345/156 |
| 8,325,263 | B2* | 12/2012 | Kato | G02B 27/017 345/8 |
| 2005/0204196 | A1* | 9/2005 | Nishimura | H01L 21/67276 714/31 |
| 2006/0150222 | A1* | 7/2006 | McCafferty | H04N 7/106 725/81 |
| 2008/0048932 | A1* | 2/2008 | Yanagisawa | G01C 21/36 345/9 |
| 2009/0271732 | A1* | 10/2009 | Kondo | G02B 27/0093 715/781 |
| 2010/0156787 | A1* | 6/2010 | Katayama | G02B 27/017 345/157 |
| 2012/0218301 | A1* | 8/2012 | Miller | G02B 27/017 345/633 |
| 2012/0249797 | A1* | 10/2012 | Haddick | G06F 1/163 348/158 |

OTHER PUBLICATIONS

Chikara Nakayama, "Thorough support for field-work using tablet Terminal or sound system", Nikkei Monozukuri Oct. 2012, Japan, Nikkei BP, Oct. 1, 2012, No. 697, pp. 56-61.

Shinji Sano, "Development of a supporting system for maintenance work in plants using augmented reality", Proceedings of Human Interface Symposium 2003, Japan, Human Interface Society, Sep. 30, 2003, pp. 357-360.

* cited by examiner

SUPPORT INFORMATION DISPLAY METHOD, MAINTENANCE SUPPORT METHOD OF SUBSTRATE PROCESSING APPARATUS, SUPPORT INFORMATION DISPLAY CONTROL APPARATUS, SUBSTRATE PROCESSING SYSTEM AND RECORDING MEDIUM

CROSS-REFERENCE TO RELATED APPLICATION

This application claims the benefit of Japanese Patent Application No. 2013-034515, filed on Feb. 25, 2013, in the Japan Patent Office, the disclosure of which is incorporated herein in its entirety by reference.

TECHNICAL FIELD

The present disclosure relates to a support information display method for providing information (support information) useful for an operator when performing a repair, maintenance, check or the like of a substrate processing apparatus configured to process a substrate such as a semiconductor wafer, a maintenance support method of the substrate processing apparatus using the support information display method, a support information display control apparatus configured to perform the support information display method, a substrate processing system provided with the support information display control apparatus, and a non-transitory computer-readable recording medium storing therein a program for a computer to execute the support information display method.

BACKGROUND

In substrate processing apparatuses that perform the plasma etching or the like on the semiconductor wafer, when a process abnormality or failure occurs, an operator monitors the status of the substrate processing apparatus by checking a view window (a view port) or a screen of the apparatus, and performs the repair or the like. In this kind of work, for the purpose of reliably and rapidly judging the result of the process or investigating the failure of the process, a substrate processing apparatus has been suggested, which collects information such as temperature, a gas flow rate, pressure, frequency, and RF power generated during the processing of the substrate, calculates the collected information and stores at least one of the collected information or calculated result.

However, the information visually obtained through the view window or the apparatus screen is limited. Further, the suggested apparatus does not disclose how to utilize the stored information for the work such as a repair work by an operator.

Further, recently, the size of the substrate processing apparatus has been increasing while the configuration thereof becomes complicated as the size of the semiconductor wafer is enlarged. Such increase in size of the substrate processing apparatus makes the work such as a repair maintenance, and inspection more increased and complicated. Especially, the operator has been experiencing difficulties to accurately understand the detailed configuration of the apparatus. Further, when the operator refers a manual or checks a configuration of the apparatus by operating a mobile computer or the like during work, it is hard to increase the work efficiency. In addition, if the operator does not have enough information on an area where the substrate processing apparatus is located, other apparatuses or machines may pose danger to the operator, e.g., hitting by an unmanned apparatus.

SUMMARY

Some embodiments of the present disclosure provide a support information display method capable of visually providing information requested by an operator or information that the operator should be informed of to the operator who carries out the maintenance, the inspection, the repair or the like of the substrate processing apparatus. Furthermore, some embodiments of the present disclosure provide a maintenance support method of the substrate processing apparatus using the support information display method, a support information display control apparatus that performs the support information display method, and a substrate processing system having the support information display control apparatus.

According to the embodiment of the present disclosure, provided is a support information display method for a computer to display support information for maintenance in real time on a head mount display which an operator wears during the maintenance of a substrate processing apparatus by the operator, the method including an acquiring process for acquiring a first image by photographing, via a camera provided in the head mount display, a predetermined part of the substrate processing apparatus as a maintenance object, an estimating process for estimating the support information related to the predetermined part in the first image from information stored in a database, an image creating process for creating a second image by converting the support information estimated in the estimating process into an image, and a displaying process for displaying the second image on the head mount display in order for the operator to visually recognize the support information.

According to the embodiment of the present disclosure, provided is a maintenance support method for supporting maintenance of a substrate processing apparatus including displaying support information about the maintenance on a head mount display of an operator in real time during the maintenance of the substrate processing apparatus by the operator, wherein a computer acquires a first image by photographing a predetermined part of the substrate processing apparatus as a maintenance object via a camera provided in the head mount display, estimates the support information related to the predetermined part in the first image from information stored in a database, creating a second image by converting the estimated support information into an image, and displays the second image on the head mount display in order for the operator to visually recognize the support information, and wherein the support information includes at least one of temperature or pressure of the predetermined part, gas species flowing through the predetermined part, a manual containing contents of the maintenance of the predetermined part, and a component replacement time of the predetermined part.

According to the embodiment of the present disclosure, provided is a support information display control apparatus for displaying support information about maintenance during a maintenance work of a substrate processing apparatus by an operator in real time on a head mount display which the operator wears, the apparatus including an image acquiring unit configured to acquire a first image by photographing a predetermined part of the substrate processing apparatus as a maintenance object via a camera provided in the head mount display, an estimation unit configured to estimate the support information related to the predetermined part in the first image from information stored in a database, an image creation unit configured to create a second image by converting the estimated support information into an image, and a display control unit configured to display the second image on the head mount display in order for the operator to visually recognize the support information, wherein the support information includes at least one of temperature or pressure of the predetermined part, gas species flowing through the predetermined part, a manual containing contents of the maintenance of the predetermined part, and a component replacement time of the predetermined part.

According to the embodiment of the present disclosure, provided is a substrate processing system including a substrate processing apparatus configured to perform predetermined processing on a substrate, a head mount display which an operator wears during maintenance of the substrate processing apparatus, a camera configured to photograph a first image viewed by the operator during the maintenance, and a support information display control apparatus configured to provide the operator with support information by displaying the support information related to the maintenance on the head mount display as a second image in real time, wherein the support information display control apparatus including an image acquiring unit configured to acquire the first image by photographing a predetermined part of the substrate processing apparatus as a maintenance object via the camera, a database configured to store information about the predetermined part in the first image, an estimation unit configured to estimate the support information related to the predetermined part from information stored in the database, an image creation unit configured to create a second image by converting the support information into an image, and a display control unit configured to display the second image on the head mount display in order for the operator to visually recognize the support information, wherein he support information includes at least one of temperature or pressure of the predetermined part, gas species flowing through the predetermined part, a manual containing contents of the maintenance of the predetermined part, and a component replacement time of the predetermined part.

According to the embodiment of the present disclosure, provided is a non-transitory computer-readable recording medium storing therein a program for allowing a computer to execute a support information display method for the computer to display support information for maintenance in real time on a head mount display which an operator wears during the maintenance of a substrate processing apparatus by the operator, the method including an acquiring process for acquiring a first image by photographing, via a camera provided in the head mount display, a predetermined part of the substrate processing apparatus as a maintenance object, an estimating process for estimating the support information related to the predetermined part in the first image from information stored in a database, an image creating process for creating a second image by converting the support information estimated in the estimating process into an image, and a displaying process for displaying the second image on the head mount display in order for the operator to visually recognize the support information.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Embodiments of the present disclosure will be described hereinafter with reference to the drawings. Here, a description is made under an assumption that a substrate processing apparatus configured to perform a plasma processing on a semiconductor wafer (referred to as a "wafer" hereinafter) having a diameter of 450 mm ($\phi$ 450) as a substrate is a target object which an operator performs a maintenance, inspection, or repair work (hereinafter, collectively referred to as "maintenance"). Further, the substrate processing apparatus is equipped with a support information display control apparatus for providing support information useful for the operator when performing the maintenance work of the substrate processing apparatus. A substrate processing system having the substrate processing apparatus will be described.

First, the overall structure of the substrate processing apparatus will be described and then configuration and a function of the substrate processing system will be described in detail.

Figure 1:
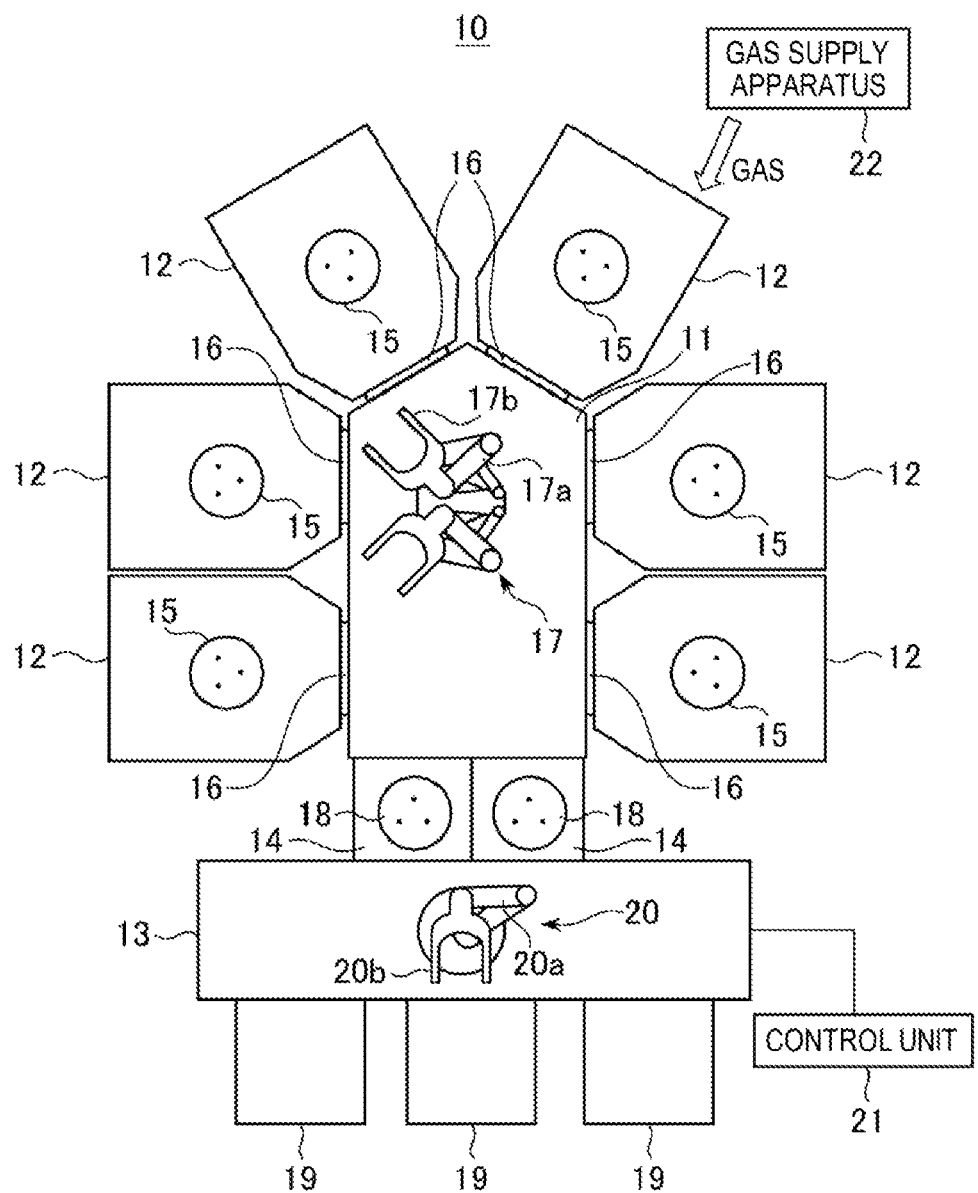
FIG. 1 is a plan view illustrating a schematic configuration of a substrate processing apparatus equipped in a substrate processing system according to an embodiment of the present disclosure.

FIG. 1 is a plan view illustrating a schematic configuration of a substrate processing apparatus 10. The substrate processing apparatus 10 is configured to individually (one by one) perform the plasma processing on the wafer W. Specifically, the substrate processing apparatus 10 includes a transfer module 11 (a substrate conveying chamber) having a substantially pentagonal shape in a plan view, six processing modules 12 (substrate processing chambers) disposed radially around the transfer module 11 and connected to the transfer module 11, a loader module 13 disposed opposite to the transfer module 11, and two load lock modules 14 (atmosphere/vacuum switching chambers) interposed between the transfer module 11 and the loader module 13.

The processing module 12 has a vacuum chamber, and a cylindrical stage 15 for mounting the wafer W is provided in the vacuum chamber. In the processing module 12, after the wafer W is mounted on the stage 15, a process gas is introduced by depressurizing the vacuum chamber, plasma is generated by applying high frequency power into the vacuum chamber, and the wafer W is subjected to the plasma processing such as etching by the generated plasma.

Further, the processing module 12 and the transfer module 11 are partitioned by an openable and closable gate valve 16. Furthermore, various gases are supplied to the processing module 12 from a gas supply unit 22 through pipes (not illustrated).

In the stage 15 equipped in the processing module 12, at least three thin rod-like lift pins are provided so as to protrude from the upper surface of the stage 15. The lift pins are disposed on the same circumference in a plan view. The wafer W mounted on the stage 15 is raised by the lift pins when the lift pins protrude from the upper surface of the stage 15, and is seated on the stage 15 when the lift pins are retracted into the stage 15.

The transfer module 11 is maintained in a vacuum (depressurized) state, and provided with a first conveying mechanism 17 disposed therein, which has two scalar arm type conveying arms 17a and a guide rail (not illustrated) disposed therein. Each of the two conveying arms 17a is configured to be pivotal and extensible/contractible and a fork 17b (an end effecter) configured to support the wafer W is attached to the tip of each of the two conveying arms 17a. The first conveying mechanism 17 is movable along the guide rail, and conveys the wafer W between each processing module 12 and each load lock module 14.

The load lock module 14 is configured with an internal pressure variable chamber capable of switching the internal pressure between a vacuum environment and an atmospheric environment. A cylindrical stage 18 for mounting the wafer W is disposed inside the load lock module 14, and the stage 18 is provided with lift pins that can protrude from the upper surface of the stage 18, similarly to the lift pins provided in the stage 15 of the processing module 12.

When conveying the wafer W from the loader module 13 to the transfer module 11, the load lock module 14 receives the wafer W from the loader module 13 after keeping the interior at the atmospheric pressure, and transfers the wafer W to the transfer module 11 after depressurizing the interior to the vacuum environment. In contrast, when conveying the wafer W from the transfer module 11 to the loader module 13, the load lock module 14 receives the wafer W from the transfer module 11 after maintaining the interior in the vacuum environment, and transfers the wafer W to the loader module 13 after pressurizing the interior to the atmospheric pressure.

The loader module 13 is a rectangular atmospheric conveying chamber, and the load lock module 14 is connected to one lateral surface of the loader module 13. A plurality (e.g., three) of FOUP (front opening universal pod) mounting tables 19 is configure to mount a FOUP (not illustrated) serving as a container which accommodates a plurality of wafers W, and is connected to the other lateral surface of the loader module 13.

A second conveying mechanism 20 configured to convey the wafer W is disposed inside the loader module 13. The second conveying mechanism 20 has a guide rail (not illustrated) and a scalar arm type conveying arm 20a. The conveying arm 20a is movable along the guide rail and is configured to be pivotal and extensible/contractible. Similarly to the first conveying mechanism 17, a fork 20b configured to support the wafer W is attached to the tip of the conveying arm 20a. In the loader module 13, the second conveying mechanism 20 conveys the wafer W between the FOUP mounted on the FOUP mounting table 19 and each load lock module 14.

For example, the substrate processing apparatus 10 has a control unit 21 implemented with, e.g., a computer. The control unit 21 controls the operation of each component (for example, the transfer module 11 or the processing module 12) of the substrate processing apparatus 10.

Figure 2:
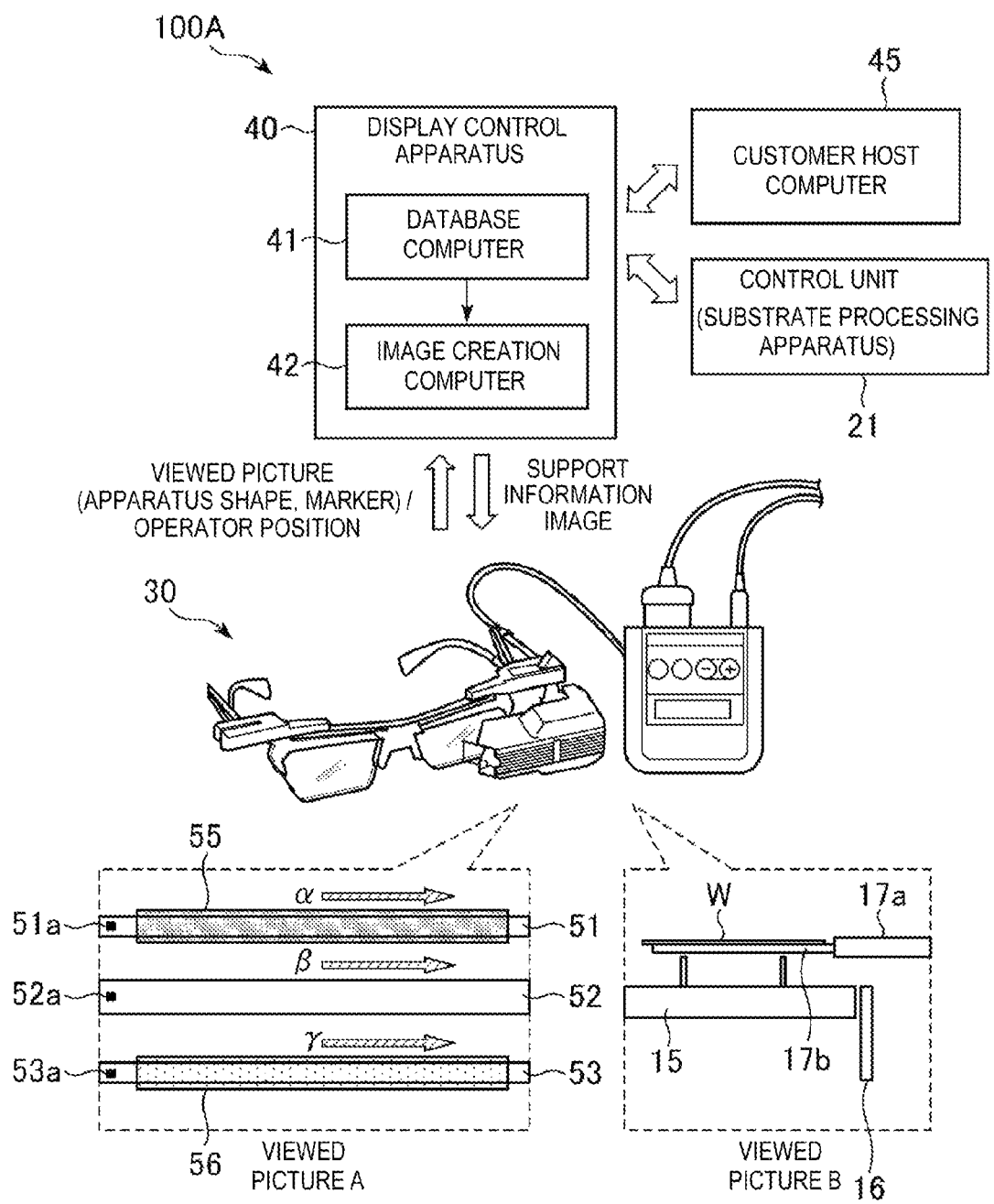
FIG. 2 is a diagram schematically illustrating a configuration of a first substrate processing system according to an embodiment of the present disclosure.

FIG. 2 is a diagram schematically illustrating an overall configuration of a first substrate processing system 100A formed by applying a support information display control apparatus 40 (hereinafter, simply referred to as "display control apparatus 40") to the substrate processing apparatus 10. The display control apparatus 40 provides information requested by a field engineer doing a maintenance work of the substrate processing apparatus 10 (hereinafter, simply referred to as an "operator"), or information that the operator should be informed of.

Generally, the substrate processing system 100A is configured to include the control unit 21 of the substrate processing apparatus 10, a head mount display 30 (hereinafter referred to as "HMD 30"), a display control apparatus 40, and a customer host computer 45. Further, the display control apparatus 40 is generally configured to include a database computer 41 and an image creation computer 42.

As illustrated in FIG. 2, the operator wears a glasses-type HMD 30. The operator putting on the HMD 30, in a same way of using general glasses or sunglasses, can visually recognize the substrate processing apparatus 10 through the HMD 30.

The HMD 30 is provided with a camera which determines a center region of the visual field of the operator on which the operator focuses by detecting an eye line of the operator and photographing (acquiring) pictures of the visual field with the center region is centered. Further, the camera attached to the HMD 30 may be provided with a zoom function of acquiring a partly enlarged image by the operation of the operator. Further, the camera may acquire a picture having a range equal to or wider than the visual field of the operator when the operator wears the HMD 30 and looks at his front. The camera may be one or more so that a plurality of images can be simultaneously acquired at the multiple viewpoints.

The pictures obtained by the camera of the HMD 30 are sent to the display control apparatus 40 from a transceiver of the HMD 30 using a wireless technique. Here, it is possible to know a position of the operator by locating the transceiver of the HMD 30 using the existing technique. Thus, the position information of the operator is continuously transmitted to the display control apparatus 40, and is used for creating the support information in the display control apparatus 40, as necessary. The support information refers to information requested by the operator or information that should be informed to the operator, and the specific examples thereof will be described below.

The database computer 41 of the display control apparatus 40 controls transmission and reception of necessary information among the control unit 21, the HMD 30, and the customer host computer 45. Further, the database computer 41 includes database including information about the maintenance of the substrate processing apparatus 10 and estimates the support information to be provided to the operator based on the information stored in the database and the information collected from the control unit 21, the HMD 30, and the customer host computer 45. Furthermore, the database computer 41 instructs the image creation computer 42 to convert the support information into an image while providing information necessary for imaging, so as to provide the support information as an image to the HMD 30. The image creation computer 42 creates an image or picture as the support information to be provided to and displayed on the HMD 30, based on the instructions from the database computer 41, and supplies the image or the picture to the HMD 30.

The HMD 30 may indicate the image or the picture supplied from the image creation computer 42, e.g., in such a way to superimpose the image or the picture on the picture visually recognized by the operator, for the recognition of the operator. The HMD 30 may indicate the image or the picture from the image creation computer 42 while hiding the visually recognized picture of the operator, or provide the image or the picture in edge regions (positions that are visible by movement of the visual line of the operator) of the visual field of the operator so that the operator can recognize the image or the picture.

The control unit 21 communicates with the display control apparatus 40 by being connected via a network such as a wireless LAN, and supplies information about the configuration or the status of the substrate processing apparatus 10 to the display control apparatus 40 in response to an inquiry from the display control apparatus 40. For example, the information includes the operative status (movement) of the first conveying apparatus 17, the degree of vacuum or the internal temperature of the vacuum chamber, the position of the wafer W, an opening/closing status of the gate valve 16 or gas species flowing in various pipes or the like, in the processing module 12.

Furthermore, for example, fixed information of the substrate processing apparatus 10, for example, the arrangement of the various pipes connected to the processing module 12, uses of various pipes, and the gas species flowing through each pipe may be registered in the database computer 41 of the display control apparatus 40 in advance. Regarding the information registered in the database computer 41, the inquiry to the control unit 21 may be omitted.

The customer host computer 45 manages a layout of a clean room or the like in which the substrate processing apparatus 10 is installed, movements of the apparatuses, machines or the like other than the substrate processing apparatus 10. The customer host computer 45 is connected to the display control apparatus 40 via a network such as a wireless LAN for communication. If the operator is a person belonging to a manufacturing company for the substrate processing apparatus 10 or an associated company, the operator may not know the layout of the clean room or the like in which the substrate processing apparatus 10 is installed, or other apparatuses disposed in the clean room or the like. Therefore, by utilizing the information held in the customer host computer 45, comprehensive support information may be supplied to the operator.

The display control apparatus 40 performs the arithmetic processing that estimates the support information such as information requested by the operator (information such as temperature (heat), pressure, gas species or the like which is not directly visible to the eyes of the operator), and information that the operator should be informed of (information about other apparatuses disposed at the area where the substrate processing apparatus 10 is installed). The support information is estimated by combining the picture information obtained through the camera of the HMD 30 with the augmented reality (AR). Further, the display control apparatus 40 provides the support information resulting from the arithmetic processing to the operator by providing in real time the support information on the HMD 30 in a form of an image or a picture so that the operator may recognize it during the maintenance work.

The display form of the support information on the HMD 30 in the substrate processing system 100A, that is, the form of providing the support information to the operator will be described by way of specific examples (first to fourth examples) below.

In a first example, information such as temperature (heat), pressure, and gas species that are not directly visible to the eyes of the operator is visualized and is superimposed on the picture of a maintenance object so that it is visible to the operator. In this case, for example, it is possible to prevent the occurrence of an accident such as getting burnt due to an inadvertent touch to an apparatus with a high temperature, and an accident such as a gas leakage caused by inadvertently opening an apparatus having a positive pressure and filled with gas.

For example, it is assumed that the operator actually looks at three pipes 51, 52, and 53 in a viewed picture A illustrated in FIG. 2, and bar codes 51a, 52a, and 53a as markers are attached to the pipes 51, 52, and 53, respectively. On the other hand, reference numerals 51 to 53, 51a to 53a, 55, and 56 used for the explanation and characters α, β, and γ described below are not displayed on the viewing picture A.

Based on a manipulation of the HMD 30 by the operator or an automatic operation triggered by the picture from the camera of the HMD 30, the database computer 41 of the display control apparatus 40 recognizes the bar codes 51a to 53a of the picture acquired from the HMD 30, and picks out the support information linked (associated) with the bar codes 51a to 53a. Here, it is assumed that information visible to the human eye such as information about gas species flowing through the pipes 51, 52 and 53, directions, hazardous materials (toxicity) is acquired as the support information. Further, the support information may be stored in the database computer 41 in advance, or may be acquired as a result of performing an inquiry to the control unit 21.

When the support information is acquired, in order to display the acquired support information on the HMD 30 as image information, the database computer 41 instructs to provide an image of the support information to the image creation computer 42. The image creation computer 42 converts the support information acquired from the database computer 41 into an image, and transmits the created image (support information image) to the HMD 30 and superimposes the same on the picture that the operator looks at.

For example, the support information from the database computer 41 may include information that the gas flowing through the pipe 51 is highly toxic, the gas flowing through the pipe 52 has no toxicity, and the gas flowing through the pipe 53 has toxicity lower than the gas flowing through the pipe 51. In this case, as shown in the viewed picture A in FIG. 2, arrows α, β, and γ indicating flows of gases are superimposed on each of the pipes 51, 52, and 53 being visually recognized by the operator. For example, a dark dot hatching frame 55 representing high toxicity is superimposed and is indicated on the pipe 51, and a light dot hatching frame 56 indicating toxicity is superimposed and is indicated on the pipe 53. This makes it possible for the operator to check the status of the pipes 51 to 53, and to pay closer attention to the toxicity of the pipes when performing the work with respect to the pipes 51 to 53.

Furthermore, the toxicity of the gas is expressed with degree of darkness of the dot in the viewed picture A of FIG. 2. However, the overall dot hatching frame 55 indicated on the pipe 51 through which the toxic gas flows can be displayed as see-through red, and the dot hatching frame 56 indicated on the pipe 53 can be displayed as see-through yellow or the like, which makes it possible to easily and intuitively identify whether the pipes includes toxic gas. In addition, the level of the toxicity of the gas may be expressed by the degree of darkness of the dot or the color, but not limited thereto, and, for example, the chemical formula of the gas species or the name thereof may also be displayed on the respective pipes.

The pipes 51 to 53 were described as an example in the viewed picture A. However, for example, when opening a lid of the vacuum chamber of the processing module 12 for maintenance thereto, it is possible to call the operator's attention to the work by indicating the pressure and the temperature of the vacuum chamber on the actually viewed picture of the lid of the vacuum chamber in different colors, (for example, blue representing the safety is displayed in case of a room pressure and a room temperature, and red representing a danger is displayed in case of depressurization and high temperature). Further, when the database computer 41 is able to acquire a flow of subsequent works varying depending on the status of the vacuum chamber, it is possible to support the work by the operator by displaying the flow on the HMD 30.

In a second example, the display control apparatus 40 visualizes the interior of the substrate processing apparatus 10. That is, the display control apparatus 40 creates a 2D graphic image or 3D graphic image of internal parts of the substrate processing apparatus 10 that is hard to view from the outside, and displays the created graphic image on the HMD 30. This enables an operator to grasp the status of the interior of the substrate processing apparatus 10 and check the operative status of various drive parts therein.

For example, since the vacuum chamber of the processing module 12 configured to perform processing in a vacuum environment that is made of an opaque material such as aluminum, it is hard to obtain information by looking into the view window. Therefore, if the operator visually recognizes bar code provided on an outer surface of the processing module 12 while looking at the processing module 12 from a certain position of an outside of the substrate processing apparatus 10, a graphic image (support information image) of the interior of the processing module 12 is displayed on the HMD 30, which is a simplified image of the interior viewed by the operator when seeing-through the processing module 12 at that position, as a viewed picture B of FIG. 2.

The graphic image of the viewed picture B can be created by an inquiry from the database computer 41 to the control unit 21 about the operative status of the substrate processing apparatus 10. The information about the operative status acquired from the control unit 21 is visualized by the image creation computer 42. It is possible to display the graphic image as a moving picture by continuously acquiring the information from control unit 21.

In displaying the graphic picture on the HMD 30, through a change of the display mode of the HMD 30, an operator may not have a direct view of the outer wall of the processing module 12 due to the screen hung down to the HMD 30, and instead can only see the graphic picture. Alternatively, it is also possible to display a graphic image to see-through the outer wall. Further, FIG. 2 illustrates the 2D graphic image, but the 3D graphic image may be used. Furthermore, depending on the visually recognized bar code, only the graphic image of the processing module 12, only the graphic image of the first conveying mechanism 17 or only the graphic image illustrating the position of the wafer W may be displayed on the HMD 30. Furthermore, reference numerals "17*b*" illustrating the fork 17*b* or the like is illustrated in the viewed picture B for convenience, but the reference numerals are not actually displayed on the HMD 30.

In a third example, the display control apparatus 40 displays information about movements of apparatuses other than the substrate processing apparatus 10, such as an unmanned conveying apparatus configured to convey the FOUP containing wafer W in the clean room in which the substrate processing apparatus 10 is installed, on the HMD 30 as the image. Thus, it is possible to prevent accidents of the operator, e.g., hitting by the unmanned conveying apparatus.

Specifically, the database computer 41 recognizes the position of the transceiver, which is configured to transmit the camera picture of the HMD 30, as the position of the operator and, at the same time, obtains information about the movement of the unmanned conveying apparatus or the like from the customer host computer 45. Furthermore, when a distance between the operator and the unmanned conveying apparatus falls below a predetermined distance, an approach of the unmanned conveying apparatus or the like to the operator, and the distance and the direction thereof are displayed on the HMD 30 as the image to allow the operator to recognize them and pay attention thereto. Thus, it is possible to ensure the safety of the operator.

In a fourth example, when a disaster occurs in the clean room in which the substrate processing apparatus 10 is installed, the display control apparatus 40 performs instructions of a coping method and an evacuation guidance for the operator. For example, when accidents (disaster) such as fire or a gas leakage from the substrate processing apparatus 10 or other apparatuses occur in the clean room during the maintenance of the substrate processing apparatus 10 by the operator, the disaster information (position of generation, kind of disaster or the like) is sent to the display control apparatus 40 from the customer host computer 45 that manages the clean room.

The display control apparatus 40 displays the received disaster information on the HMD 30 by converting the information to an image, and simultaneously displays the coping methods (for example, an instruction about an installation position of a fire extinguisher in the case of small fire, an operating procedure for closing an emergency opening/closing valve in case of a gas leakage, an instruction about an evacuation route from the clean room or the like). Thus, it is possible to ensure a safety of the operator and to suppress a possibility of accidents developing into a serious disaster.

Figure 3:
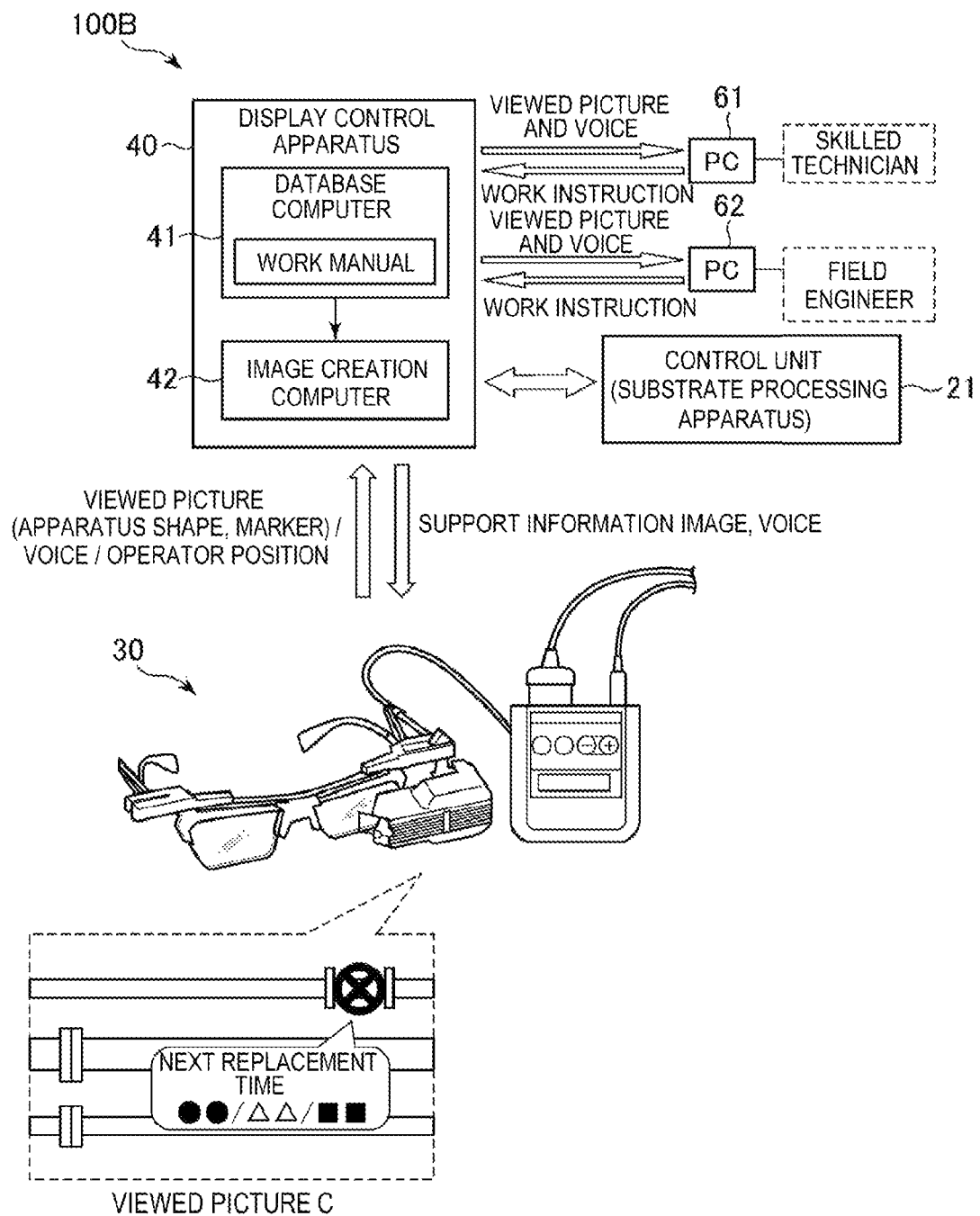
FIG. 3 is a diagram schematically illustrating a configuration of a second substrate processing system according to an embodiment of the present disclosure.

FIG. 3 is a diagram schematically illustrating an overall configuration of a second substrate processing system 100B formed by applying the display control apparatus 40, configured to provide necessary information to the operator working at the substrate processing apparatus 10 to the substrate processing apparatus 10.

The substrate processing system 100B is different from the substrate processing system 100A illustrated in FIG. 2. In other words, the display control apparatus 40 of the substrate processing system 100B is not linked to the customer host computer 45 and instead is linked to personal computers (PC) 61 and 62 as information terminals located at a remote location different from the installation location of the substrate processing apparatus 10 via a network (not illustrated) such as the Internet. Further, the database computer 41 of the display control apparatus 40 includes a manual for a maintenance work of the substrate processing apparatus 10. Furthermore, audio information from the operator can be transmitted to the display control apparatus 40, and the operator is able to obtain audio information from the display control apparatus 40. Furthermore, it is also possible to replace the PCs 61 and 62 with a so-called smart phone (a mobile phone).

The display form of the support information to the HMD 30 in the substrate processing system 100B, that is, the form of providing the support information to the operator will be described based on specific examples (fifth to seventh examples) below.

In the fifth example, the display control apparatus 40 displays the necessary manual when performing the maintenance of the substrate processing apparatus 10 on the HMD 30 of the operator. The manual may be manually displayed on the HMD 30 by the operator. In one embodiment, the database computer 41 may specify the position of the operator using the wireless techniques described above and the manual associated with the specified position may be displayed. Alternatively, when a mark such as a bar code provided on the apparatus is recognized, the manual associated with the mark may be displayed.

Thus, since there is no need for the operator to refer a manual booklet (sheet medium), a personal computer, or an operation screen of the substrate processing apparatus 10, it is possible to increase the work efficiency and reliability of the maintenance. Further, a configuration, in which the procedures are shown with images and the descriptions are given with characters, enables the operator to perform the maintenance by comparing the image provided by the manual with a visually recognized maintenance object, thereby making it possible to perform the work precisely.

In a sixth example, the display control apparatus 40 superimposes and displays information about components (including the consumable components) having an upcoming replacement time, and the replacement time thereof on the viewed picture as images. For this, it is necessary that at least one of the display control apparatus 40 or the control unit 21 keeps the information about the next component replacement time which can be determined based on, e.g., past maintenance results. A viewed picture C of FIG. 3 illustrates a state in which an image indicating an approach of the time for replacing a component, e.g., a packing near a valve, is superimposed and displayed on the visually recognized image.

The operator can determine whether or not to replace the component based on the information indicating the time for replacing that component. Further it is possible for either of the display control apparatus 40 or the control unit 21 to keep inventory information on the new component for replacement. By doing this, for example, in case where a replacement of the component is in stock, a background of the information indicating the time for replacing the component may be set to a light blue, and in case of no replacement is in stock, the background may be set to yellow. In this manner, it is possible to provide replacement information to the operator in order for the operator to determine as to whether the replacement is available.

Further, as described with reference to the substrate processing system 100A of FIG. 2, when the interior of the substrate processing apparatus 10 is displayed on the MID 30 in a form of the graphic picture thereof, imaged information indicating the time for replacing the component may be superimposed as an indication on the graphic image. Thus, even for a part which is not directly viewable, the maintenance of its components can be reliably performed.

In a seventh example, the support information is sent to the operator who actually performs the maintenance of the substrate processing apparatus 10 from the engineer or the like located at a remote location far from the installation location of the substrate processing apparatus 10. As a result, the operator can perform the work more appropriately. For example, the display control apparatus 40 transmits information of pictures visually recognized by the operator and the audio information of the operator to the PCs 61 and 62 in real time. In this case, a clearer picture of a work object can be sent to the PCs 61 and 62 by photographing the work object in an enlarged scale. A skilled engineer or other engineers (field engineers or the like) watching the images displayed on monitors of the PCs 61 and 62 can check the work results, while advising (instructing) the operator an appropriate and specific work process or actions to take in case of an emergency/accident/disaster. This makes it possible to increase the work efficiency of the operator, and to take more appropriate action in case of an emergency/accident/disaster.

Further, in some embodiments, the image obtained by visualizing the information, such as temperature (heat), pressure, and gas species that is not directly visible to the eyes of the operator as described in the first example, is superimposed on the image being displayed on the monitor of the PCs 61 and 62, whereby transmitting more detailed information about the work object to skilled engineers or other technicians. This enables skilled engineers or other technicians to more easily and accurately understand the current situation.

The above examples exemplify cases where there is one operator. However, in a case where the maintenance needs a plurality of operators, each individual operator may put on the HMD 30 to receive the support information from the display control apparatus 40, thereby ensuring the safety of the operators performing the maintenance work.

Figure 4:
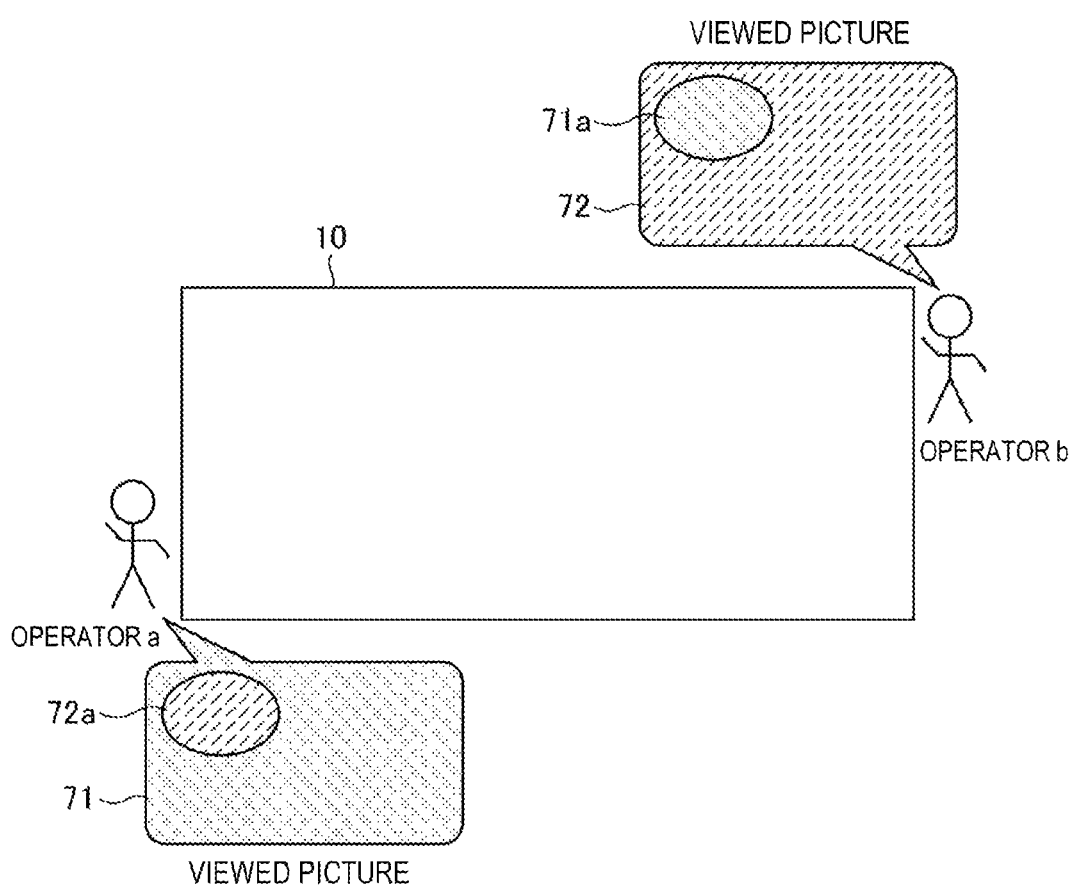
FIG. 4 is a diagram schematically illustrating positions of operators and pictures visible to the operators in a work by two operators with respect to the substrate processing system of FIG. 2 or 3.

FIG. 4 is a diagram schematically illustrating a position of each operator and his or her viewed picture (visual field) in a work performed by two operators. In FIG. 4, since operators a and b are located at positions with the substrate processing apparatus 10 interposed therebetween, the operators a and b cannot see each other. In such a situation, in case where the operators a and b need to perform the maintenance in corporation with each other, for example, when one operates a power supply while the other checks wiring associated with the power supply operation, a picture 71 actually viewed by the operator a is projected on an edge of the visual field of the HMD 30 of the operator b as an image 71a. On the other hand, a picture 72 actually viewed by the operator b is projected on an edge of the visual field of the HMD 30 of the operator a as an image 72a. In other words, the visual point of one operator is projected on the counterpart's HMD 30.

Thus, since the operators a and b are able to check the operation of the partner, it is possible to prevent accidents resulting from a situation where the operators do not have a direct view of each other, such as mistakenly turning on the power supply while wiring being checked. Further, the viewed pictures illustrated in FIG. 4 may be obtained using any one of the substrate processing system 100A of FIG. 2 or the substrate processing system 100B of FIG. 3. However, using the substrate processing system 100B makes it easier to use the audio information of the operator and the image information together.

As described above, according to the embodiment of the present disclosure, the operators involved in the maintenance of the substrate processing apparatus 10 are able to acquire information necessary for performing the maintenance work or information that the operator should be informed of in real time. Thus, it is possible to accurately and rapidly perform the maintenance work and to suppress the occurrence of accident.

Although the embodiments of the present disclosure have been described above, the present disclosure is not limited to the embodiments described above. For example, it is possible to combine the functions of the various examples described above that can be performed in the substrate processing systems 100A and 100B.

Furthermore, the HMD 30 may be provided with a function of detecting a diameter and brightness of the operator's pupil, and a function of measuring the time (work time) after the HMD 30 is turned ON (or the display control apparatus 40 may be provided with a function of measuring the time after the start of receiving the pictures from the HMD as the work time), and the display control apparatus 40 may estimate the degree of fatigue of the operator based on the pupil diameter and the work time and may display the image prompting a break of the operator on the HMD. Thus, it is possible to prevent the occurrence of accidents due to fatigue of the operator.

Further, in the embodiment described above, although the system has been configured by combining the display control apparatus 40 with the substrate processing apparatus 10 that performs the plasma process on the wafer W, the apparatus that can be combined with the display control apparatus 40 is not limited thereto, and it is also possible to configure the system by combining the display control apparatus 40 with other semiconductor manufacturing apparatuses such as a cleaning apparatus, a film forming apparatus, and a thermal treatment apparatus. Furthermore, display control apparatus 40 can be applied to overall apparatuses requiring maintenance without being limited to the semiconductor manufacturing apparatus, and, for example, the apparatus 40 can be applied to a substrate processing apparatus or the like that handles a glass substrate such as a liquid crystal panel.

According to some embodiments of the present disclosure, it is possible to visually provide the operator such as a field engineer with information requested by the operator and information that the operator should be informed of in real time while performing the maintenance work such as maintenance, inspection, and repair, by combination of a head mount display (HMD) with augmented reality (AR).

Specifically, an image equivalent to a current view of an operator through the HMD is acquired by a camera detecting the eye line of the operator, and various kinds of information stored in a database are converted into an image or visualized and may be displayed on the HMD alone or by superimposing the various kinds of information on the acquired image. Thus, for example, the operator is able to acquire information that is not visually recognized such as temperature, gas species, and pressure, which is superimposed on an image of a pipe and a chamber that are actually viewed, so that the operator can safely perform the work. Furthermore, it is possible to actively support the work by displaying an appropriate work manual on the HMD in real time according to the progress of the work. Furthermore, it is possible to perform the more detailed maintenance by displaying the time for replacing consumable components of a maintenance object to which the operator has a view.

In addition, skilled engineers may monitor the image visible to an operator in real time, and instruct a specific work or the like to an operator, thereby making it possible to increase the work efficiency, and to perform the more suitable actions. In addition, in a work by multiple people, even if it is not possible to directly view a co-worker at the blind spot, an occurrence of accidents caused by the situation in which the workers cannot see each other may be prevented by performing the work while mutually checking the images of other workers.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A support information display method for a computer to display support information for maintenance in real time on a head mount display which an operator wears during the maintenance of a substrate processing apparatus by the operator, the method comprising:
    an acquiring process for acquiring a first image photographed via a camera provided in the head mount display;
    an estimating process for estimating the support information related to a predetermined part in the first image from information stored in a database;
    a disaster information acquiring process for acquiring disaster information on a disaster occurring on a place in which the substrate processing apparatus is provided or alarm information indicating that another apparatus installed at the place approaches the operator;
    an image creating process for creating a second image by converting the support information estimated in the estimating process into an image and creating a third image by converting the disaster information and the alarm information acquired in the disaster information acquiring process into an image; and
    a displaying process for displaying the second image and the third image on the head mount display in order for the operator to visually recognize the support information, the disaster information, and the alarm information.

2. The method of claim 1, wherein the predetermined part is a part of the substrate processing apparatus as a maintenance object, and wherein the support information includes at least one of temperature or pressure of the predetermined part, gas species flowing through the predetermined part, a component replacement time of the predetermined part, and a manual containing contents of the maintenance of the predetermined part of the substrate processing apparatus.

3. The method of claim 1, wherein, the second image is superimposed and displayed on a picture of the predetermined part that is visible to the operator.

4. The method of claim 1, wherein, in the displaying process, when there are multiple operators, the first image by the camera of the head mount display of one operator is displayed on the head mount display of other operators.

5. The method of claim 1, further comprising:
    a remote displaying process for remotely displaying, via a network, the first image on a display of an information terminal in a place different from a place in which the substrate processing apparatus is installed; and
    a transmitting process for transmitting an advice from a person watching the first image displayed on the display for the information terminal to the operator.

6. The method of claim 1, wherein a graphic image of the predetermined part is further created in the image creating process and, only the graphic image is visually recognized to the operator without having a direct view to the predetermined part by a screen hung down to the head mount display.

7. A maintenance support method for supporting maintenance of a substrate processing apparatus comprises:
displaying support information about the maintenance on a head mount display of an operator in real time during the maintenance of the substrate processing apparatus by the operator,
wherein a computer acquires a first image photographed via a camera provided in the head mount display, estimates the support information related to a predetermined part in the first image from information stored in a database, acquires disaster information on a disaster occurring on a place in which the substrate processing apparatus is provided or alarm information indicating that another apparatus installed at the place approaches the operator, creates a second image by converting the estimated support information into an image, creates a third image by converting the disaster information and the alarm information into an image, and displays the second image and the third image on the head mount display in order for the operator to visually recognize the support information, the disaster information, and the alarm information.

8. A support information display control apparatus for displaying support information about maintenance during a maintenance work of a substrate processing apparatus by an operator in real time on a head mount display which the operator wears, the apparatus comprising:
a database computer configured to receive, from the head mount display, a first image photographed via a camera provided in the head mount display, configured to estimate the support information related to a predetermined part in the first image from information stored in a database, and configured to receive, from an external computer, disaster information on a disaster occurring on a place in which the substrate processing apparatus is provided or alarm information indicating that another apparatus installed at the place approaches the operator; and
an image creation computer configured to create a second image by converting the estimated support information into an image, configured to create a third image by converting the disaster information and the alarm information into an image, and configured to transmit the second image and the third image to the head mount display so that the second image and the third image are displayed on the head mount display in order for the operator to visually recognize the support information, the disaster information, and the alarm information.

9. The apparatus of claim 8, wherein the display control unit displays the first image on a display of an information terminal in a place different from a place in which the substrate processing apparatus is installed and transmits an advice from a person watching the first image displayed on the display of the information terminal to the operator.

10. A substrate processing system comprising:
a substrate processing apparatus having a controller configured to control operation of each component of the substrate processing apparatus to perform predetermined processing on a substrate;
a head mount display which an operator wears during maintenance of the substrate processing apparatus;
a camera provided in the head mount display and configured to photograph a first image viewed by the operator during the maintenance; and
a support information display control apparatus configured to provide the operator with support information by displaying the support information related to the maintenance on the head mount display as a second image in real time,
wherein the support information display control apparatus communicates with the substrate processing apparatus and the head mount display via a network,
wherein the support information display control apparatus comprises:
a database configured to store information about a predetermined part in the first image;
a database computer configured to receive the first image from the head mount display, configured to estimate the support information related to the predetermined part from information stored in the database, and configured to receive, from an external computer, disaster information on a disaster occurring on a place in which the substrate processing apparatus is provided or alarm information indicating that another apparatus installed at the place approaches the operator;
an image creation computer configured to create a second image by converting the support information into an image, configured to create a third image by converting the disaster information and the alarm information into an image, and configured to transmit the second image and the third image to the head mount display so that the second image and the third image are displayed on the head mount display in order for the operator to visually recognize the support information, the disaster information, and the alarm information.

11. The system of claim 10, wherein the substrate processing apparatus is a semiconductor manufacturing apparatus configured to process a semiconductor wafer.

12. The system of claim 10, further comprising:
an information terminal connected to the support information display control apparatus via a network,
wherein the support information display control apparatus displays the same image as the image displayed on the head mount display on a display of the information terminal.

13. A non-transitory computer-readable recording medium storing therein a program for allowing a computer to execute a support information display method for the computer to display support information for maintenance in real time on a head mount display which an operator wears during the maintenance of a substrate processing apparatus by the operator, the method comprising:
an acquiring process for acquiring a first image photographed via a camera provided in the head mount display;
an estimating process for estimating the support information related to a predetermined part in the first image from information stored in a database;
a disaster information acquiring process for acquiring disaster information on a disaster occurring on a place in which the substrate processing apparatus is provided or alarm information indicating that another apparatus installed at the place approaches the operator;
an image creating process for creating a second image by converting the support information estimated in the estimating process into an image and creating a third image by converting the disaster information and the alarm information acquired in the disaster information acquiring process into an image; and a displaying process for displaying the second image and the third image on the head mount display in order for the operator to visually recognize the support information, the disaster information, and the alarm information.

14. The method of claim 7, wherein the predetermined part is a part of the substrate processing apparatus as a maintenance object, and wherein the support information includes at least one of temperature or pressure of the predetermined part, gas species flowing through the predetermined part, a component replacement time of the predetermined part, and a manual containing contents of the maintenance of the predetermined part of the substrate processing apparatus.

15. The apparatus of claim 8, wherein the predetermined part is a part of the substrate processing apparatus as a maintenance object, and wherein the support information includes at least one of temperature or pressure of the predetermined part, gas species flowing through the predetermined part, a component replacement time of the predetermined part, and a manual containing contents of the maintenance of the predetermined part of the substrate processing apparatus.

16. The system of claim 10, wherein the predetermined part is a part of the substrate processing apparatus as a maintenance object, and wherein the support information includes at least one of temperature or pressure of the predetermined part, gas species flowing through the predetermined part, a component replacement time of the predetermined part, and a manual containing contents of the maintenance of the predetermined part of the substrate processing apparatus.

17. The recording medium of claim 13, wherein the predetermined part is a part of the substrate processing apparatus as a maintenance object, and wherein the support information includes at least one of temperature or pressure of the predetermined part, gas species flowing through the predetermined part, a component replacement time of the predetermined part, and a manual containing contents of the maintenance of the predetermined part of the substrate processing apparatus.

* * * * *